United States Patent
Cagno et al.

(10) Patent No.: US 7,782,126 B2
(45) Date of Patent: Aug. 24, 2010

(54) DETECTION AND ACCOMMODATION OF HOT-PLUG CONDITIONS

(75) Inventors: Brian James Cagno, Tucson, AZ (US); Gregg Steven Lucas, Tucson, AZ (US); Tohru Sumiyoshi, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 52 days.

(21) Appl. No.: 12/021,334

(22) Filed: Jan. 29, 2008

(65) Prior Publication Data

US 2009/0189646 A1 Jul. 30, 2009

(51) Int. Cl.
H03B 1/00 (2006.01)
H03K 5/00 (2006.01)
H04B 1/10 (2006.01)

(52) U.S. Cl. .................. 327/551; 327/54; 327/205; 327/206

(58) Field of Classification Search .................. 327/52, 327/53, 58, 60, 62, 63, 65–69, 71, 72, 74, 327/77–81, 88, 89, 96, 127, 205, 206, 246, 327/266, 274, 280, 287, 359, 551–559, 560–563
See application file for complete search history.

(56) References Cited

U.S. PATENT DOCUMENTS

| | | | |
|---|---|---|---|
| 4,233,563 A * | 11/1980 | Schanbacher | 327/13 |
| 5,272,584 A * | 12/1993 | Austruy et al. | 361/58 |
| 5,376,831 A | 12/1994 | Chen | |
| 5,698,973 A | 12/1997 | Goerke et al. | |
| 5,861,737 A | 1/1999 | Goerke et al. | |
| 5,898,844 A | 4/1999 | Thompson | |
| 5,963,083 A | 10/1999 | Kothandaraman et al. | |
| 6,102,742 A | 8/2000 | Daly | |
| 6,353,523 B1 | 3/2002 | Niv et al. | |
| 6,821,156 B1 * | 11/2004 | Egan et al. | 439/630 |
| 6,917,503 B2 | 7/2005 | Dai et al. | |
| 7,245,468 B2 | 7/2007 | Griesbach et al. | |

* cited by examiner

*Primary Examiner*—Lincoln Donovan
*Assistant Examiner*—Brandon S Cole
(74) *Attorney, Agent, or Firm*—Francis Lammes; Stephen J. Walder, Jr.; Randall J. Bluestone (57) ABSTRACT

A mechanism is provided for a one card to filter false signals due to a another card being hot-plugged. A discriminator circuit in the card receives a low-state signal via an input and, responsive to receiving the low-state signal, the discriminator circuit compares the low-state signal to a static signal. Responsive to the low-state signal being greater than the static signal, the discriminator circuit outputs a high-voltage signal. The high-voltage signal output by the discriminator circuit indicates that the low-state signal is a false low signal. Responsive to the low-state signal being less than or equal to the static signal, the discriminator circuit outputs a low-voltage signal. The low-voltage signal output by the discriminator circuit indicates that the low-state signal is a valid low signal.

17 Claims, 7 Drawing Sheets

DETECTION AND ACCOMMODATION OF HOT-PLUG CONDITIONS

BACKGROUND

1. Technical Field

The present application relates generally to an improved data processing apparatus and method. More specifically, the present application is directed to a detection and accommodation of hot-plug conditions.

2. Description of Related Art

Many computer systems are designed to be continuously powered on for extended periods of time. As well, redundancy is employed throughout many computer systems for modules, such as power supplies, server blades, management modules, switch modules, and even integrated storage with Redundant Array of Independent Drives (RAID) controllers. Redundancy allows for one of these elements to be replaced concurrently within the computer system in operation. A typical scenario occurs when one module, such as a server blade, fails and a service action is required to replace the failed module. Under this condition, the faulty module may be removed and replaced with a new one, which may be referred to as "hot plugging" and "hot unplugging".

Figure 1:
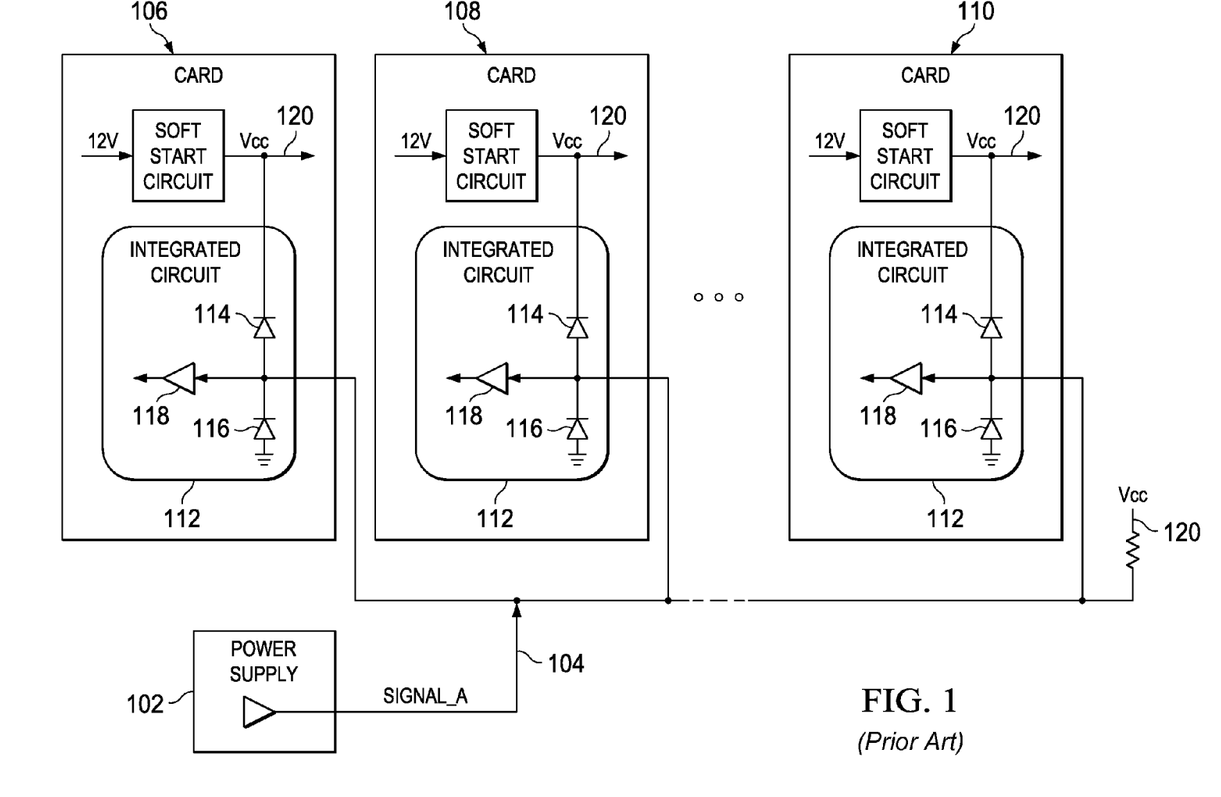
FIG. 1 illustrates a typical distributed circuit within a blade server.

A standard for such computer systems is to also implement electrical signals that are shared across multiple modules or server blades. FIG. 1 illustrates a typical distributed circuit within a blade server. Power supply 102 generates Signal_A 104 that is distributed and received by multiple blades 106, 108, and 110. Receiver circuitry 112 on blades 106, 108, and 110 includes electrical static discharge (ESD) protection clamp diodes 114 and 116. ESD protection clamp diodes 114 and 116 are used to prevent electrical overload (i.e. damage) to receiver input structure 118 during hot-plug and hot-unplug conditions. ESD protection clamp diodes 114 and 116 also protect against static electricity when the blades 106, 108, and 110 are handled. ESD protection clamp diode 114 clamps the operating voltage to Vcc 120 in order to prevent Signal_A 104 in blades 106, 108, and 110 from exceeding Vcc 120 by more than a diode drop. A diode drop is the voltage drop that is developed across the anode and cathode of a diode, such as ESD protection clamp diodes 114 and 116, when the diode is forward biased. This voltage drop varies as a function of the type of diode, e.g. Schottky diode, clamp diode, and the like, as well as the current flowing through the diode. ESD protection clamp diodes 114 and 116 generally present a voltage drop or diode drop of 1 volt. If Signal_A 104 exceeds Vcc 120, the excess voltage can cause PN junctions, inherent in receiver input structure 118, to be substantially reversed biased resulting in excessive current flow and very likely damaging blades 106, 108, and 110. A PN junction is an interface within diodes, transistors, and other semiconductor devices between two different types of materials called p-type and n-type semiconductors.

A side effect of ESD protection clamp diodes 114 and 116 is that ESD protection clamp diodes 114 and 116 become forward biased (i.e. conduct electricity) for a short period of time when blade 106, 108, or 110 is hot plugged. This forward bias condition will result in the shared signal being clamped to, for example, one diode drop, Vdiode, above ground, or the like. All server blades that incorporate this signal will be exposed to this condition.

Figure 2:
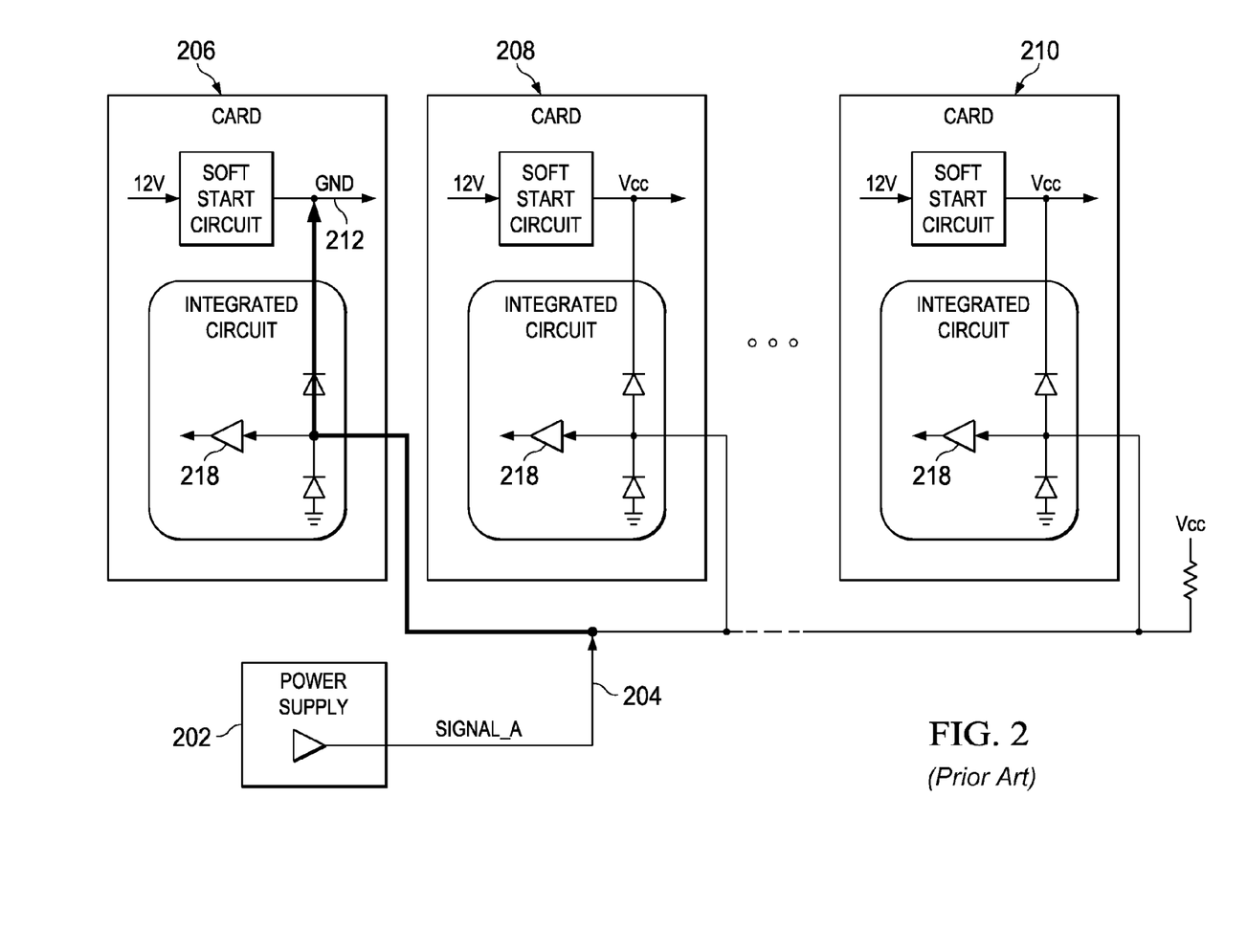
FIG. 2 illustrates an exemplary hot-plug scenario in a distributed circuit within a blade server.

FIG. 2 illustrates an exemplary hot-plug scenario in a distributed circuit within a blade server. Considering that Signal_A 204 from power supply 202 normally operates at a high-voltage level and during a hot-plug scenario of blade 206, Signal_A 204 may become clamped to a voltage level that is one diode drop above low-voltage level 212, whereby, receiver input structure 218 on each of blades 208 and 210 will detect such a falsely asserted Signal_A 204 condition, causing the overall system to become adversely affected.

Figure 3:
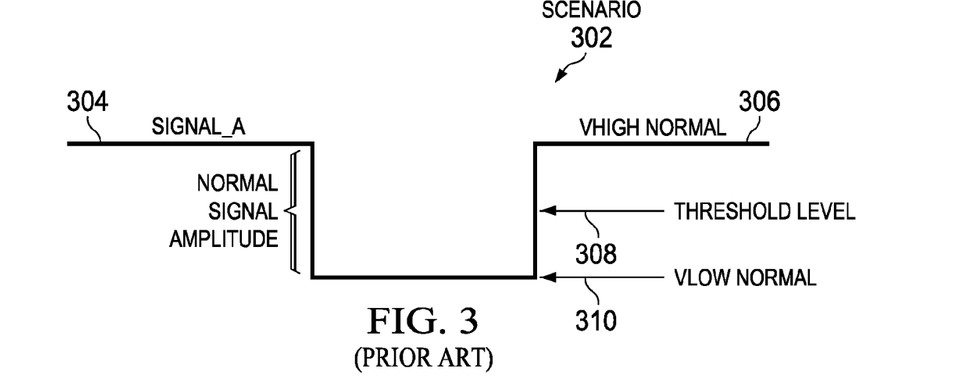
FIG. 3 illustrates a normal signal amplitude.

FIG. 3 illustrates a normal signal amplitude. In scenario 302, Signal_A 304 is normally inactive at a normal high-voltage level, Vhigh normal 306. All circuitry receiving Signal_A 304 has a built-in threshold level 308 that will discriminate between different voltage levels. A normal transition of Signal_A 304 will produce a normal amplitude swing and the receivers will detect it as a normal low-voltage level, Vlow normal 310.

Figure 4:
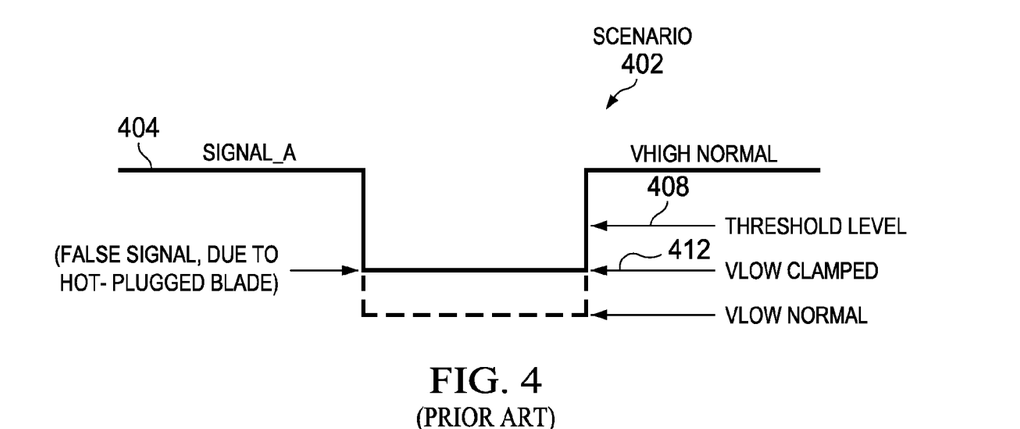
FIG. 4 illustrates a false signal amplitude that may occur during a hot-plug scenario.

FIG. 4 illustrates a false signal amplitude that may occur during a hot-plug scenario. In contrast to scenario 302 of FIG. 3, scenario 402 illustrates when a blade, such as blade 206 of FIG. 2 is hot plugged. In scenario 402, Signal_A 404 becomes clamped to an intermediate voltage level, Vlow clamped 412. Since Vlow clamped 412 is below threshold level 408 it is detected by the receiver circuits as a low-voltage level which in effect is a false assertion of Signal_A 404.

Therefore, in addition to adversely affecting a given shared signal as described above, the process of hot plugging a card into a shared electrical system may also cause unwanted behavior to normally operating signals that are shared or not shared amongst the various blade cards. For example, if Blade A implements some signals to Blade B, such as reset signals, clock signals or control/status/interrupt signals, then when Blade A is initially hot plugged (before Blade A's soft start voltage circuitry becomes energized) these signals can be non-deterministic during the course of the soft start voltage boundary being energized. Such unknown signal states can adversely affect Blade B which normally monitors and reacts to these signals.

SUMMARY

The illustrative embodiments utilize the behavior of electrical static discharge (ESD) clamp diodes in common receiver circuitry to detect when a card is hot plugged or hot unplugged into a shared electrical system. The illustrative embodiments provide a discriminator circuit to detect a hot-plug or hot-unplug condition and prevent unwanted behavior by the normally operating installed card. The discriminator circuitry not only maintains proper electrical operation between and amongst the cards, but also can prevent abnormal effects to circuitry that receives the specific hot-plug or hot-unplug indication.

The illustrative embodiments provide a discriminator circuit that receives a low-state signal via an input. In the illustrative embodiments, upon receiving the low-state signal, the illustrative embodiments compare the low-state signal to a static signal. Responsive to the low-state signal being greater than the static signal, the illustrative embodiments output a high-voltage signal. The high-voltage signal output by the discriminator circuit indicates that the low-state signal is a false low signal. Responsive to the low-state signal being less than or equal to the static signal, the illustrative embodiments output a low-voltage signal, wherein the low-voltage signal output by the discriminator circuit indicates that the low-state signal is a valid low signal.

In the illustrative embodiments, the low-state signal may be the result of a card being hot plugged into a data processing system. In the illustrative embodiments, the discriminator circuit may comprise at least one of a resistor divider network, a noise suppression network, a hysteresis network, and an op amp.

In the illustrative embodiments, the resistor divider network may comprise a first resistor and a second resistor. In the illustrative embodiments, the first resistor may be coupled to a voltage source, the second resistor, an input of the op amp, and the noise suppression network. In the illustrative embodiments, the second resistor may be coupled to a zero potential ground, the first resistor, the input of the op amp, and the noise suppression network. In the illustrative embodiments, the resistor divider network may provide the static signal to the input of the op amp.

In the illustrative embodiments, the noise suppression network may comprise a resistor and a capacitor. In the illustrative embodiments, the resistor may be coupled to the low-state signal, the hysteresis network, and the capacitor. In the illustrative embodiments, the capacitor may be coupled to the resistor, the hysteresis network, an input of the op amp, and the resistor divider network.

In the illustrative embodiments, the hysteresis network may comprise a first resistor and a second resistor. In the illustrative embodiments, the first resistor may be coupled to the noise suppression network, the second resistor, and an input of the op amp. In the illustrative embodiments, the second resistor may be coupled to the first resistor, the input of the op amp, and an output of the op amp.

In the illustrative embodiments, the op amp may comprise a voltage source connection, a ground connection, a first input, a second input, and an output. In the illustrative embodiments, the voltage source connection may be coupled to a voltage source. In the illustrative embodiments, the ground connection may be coupled to a zero potential ground. In the illustrative embodiments, the first input may be coupled to the hysteresis network. In the illustrative embodiments, the second input may be coupled to the resistor divider network and the noise suppression network. In the illustrative embodiments, the output may be coupled to the hysteresis network and the output may provide at least one of the high-voltage signal or the low-voltage signal based on the comparison of the low-state signal to the static signal.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE
ILLUSTRATIVE EMBODIMENTS

Figure 5:
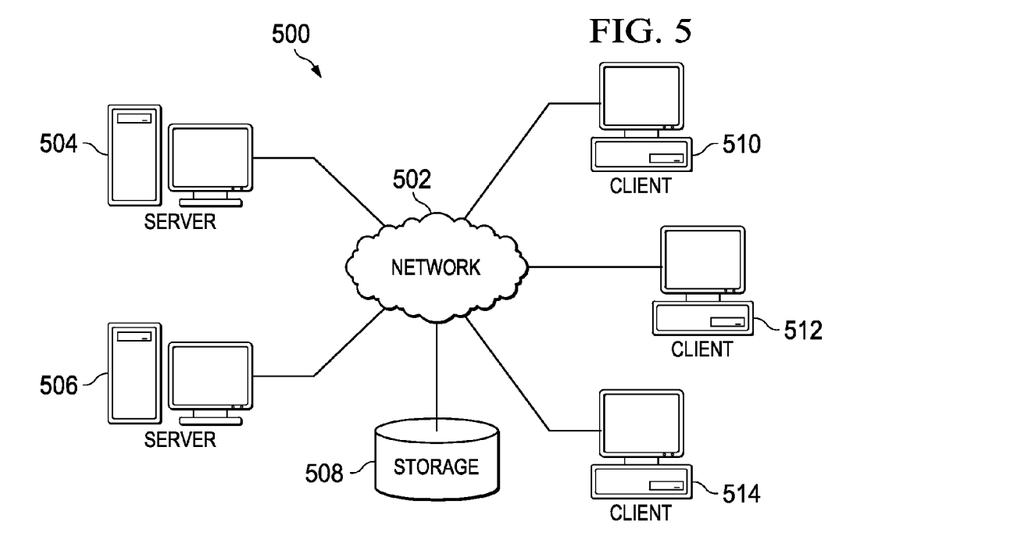
FIG. 5 is an exemplary representation of an exemplary distributed data processing system in which aspects of the illustrative embodiments may be implemented.
Figure 6:
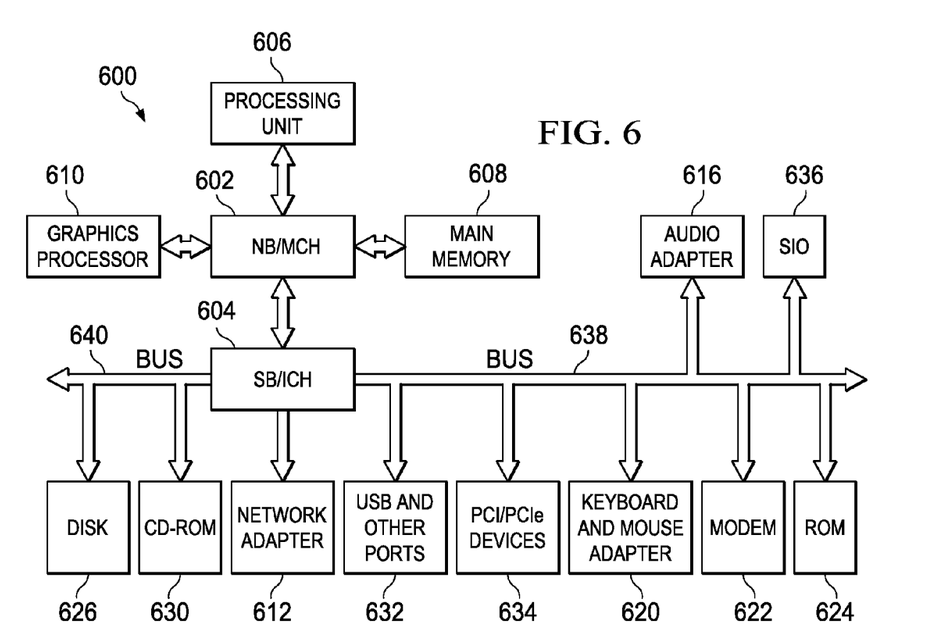
FIG. 6 is a block diagram of an exemplary data processing system in which aspects of the illustrative embodiments may be implemented.

The illustrative embodiments provide for detecting and accommodating hot-plug conditions. As such, the mechanisms of the illustrative embodiments are especially well suited for implementation within a distributed data processing environment and within, or in association with, data processing devices, such as servers, client devices, and the like. In order to provide a context for the description of the mechanisms of the illustrative embodiments, FIGS. 5 and 6 are provided hereafter as examples of a distributed data processing system, or environment, and a data processing device, in which, or with which, the mechanisms of the illustrative embodiments may be implemented. It should be appreciated that FIGS. 5 and 6 are only exemplary and are not intended to assert or imply any limitation with regard to the environments in which aspects or embodiments of the present invention may be implemented. Many modifications to the depicted environments may be made without departing from the spirit and scope of the present invention.

With reference now to the figures, FIG. 5 depicts a pictorial representation of an exemplary distributed data processing system in which aspects of the illustrative embodiments may be implemented. Distributed data processing system 500 may include a network of computers in which aspects of the illustrative embodiments may be implemented. The distributed data processing system 500 contains at least one network 502, which is the medium used to provide communication links between various devices and computers connected together within distributed data processing system 500. The network 502 may include connections, such as wire, wireless communication links, or fiber optic cables.

In the depicted example, server 504 and server 506 are connected to network 502 along with storage unit 508. In addition, clients 510, 512, and 514 are also connected to network 502. These clients 510, 512, and 514 may be, for example, personal computers, network computers, or the like. In the depicted example, server 504 provides data, such as boot files, operating system images, and applications to the clients 510, 512, and 514. Clients 510, 512, and 514 are clients to server 504 in the depicted example. Distributed data processing system 500 may include additional servers, clients, and other devices not shown.

In the depicted example, distributed data processing system 500 is the Internet with network 502 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 500 may also be implemented to include a number of different types of networks, such as for example, an intranet, a local area network (LAN), a wide area network (WAN), or the like. As stated above, FIG. 5 is intended as an example, not as an architectural limitation for different embodiments of the present invention, and therefore, the particular elements shown in FIG. 5 should not be considered limiting with regard to the environments in which the illustrative embodiments of the present invention may be implemented.

With reference now to FIG. 6, a block diagram of an exemplary data processing system is shown in which aspects of the illustrative embodiments may be implemented. Data processing system 600 is an example of a computer, such as client 510 in FIG. 5, in which computer usable code or instructions implementing the processes for illustrative embodiments of the present invention may be located.

In the depicted example, data processing system 600 employs a hub architecture including north bridge and memory controller hub (NB/MCH) 602 and south bridge and input/output (I/O) controller hub (SB/ICH) 604. Processing unit 606, main memory 608, and graphics processor 610 are connected to NB/MCH 602. Graphics processor 610 may be connected to NB/MCH 602 through an accelerated graphics port (AGP).

In the depicted example, local area network (LAN) adapter 612 connects to SB/ICH 604. Audio adapter 616, keyboard and mouse adapter 620, modem 622, read only memory (ROM) 624, hard disk drive (HDD) 626, CD-ROM drive 630, universal serial bus (USB) ports and other communication ports 632, and PCI/PCIe devices 634 connect to SB/ICH 604 through bus 638 and bus 640. PCI/PCIe devices may include, for example, Ethernet adapters, add-in cards, and PC cards for notebook computers. PCI uses a card bus controller, while PCIe does not. ROM 624 may be, for example, a flash basic input/output system (BIOS).

HDD 626 and CD-ROM drive 630 connect to SB/ICH 604 through bus 640. HDD 626 and CD-ROM drive 630 may use, for example, an integrated drive electronics (IDE) or serial advanced technology attachment (SATA) interface. Super I/O (SIO) device 636 may be connected to SB/ICH 604.

An operating system runs on processing unit 606. The operating system coordinates and provides control of various components within the data processing system 600 in FIG. 6. As a client, the operating system may be a commercially available operating system such as Microsoft® Windows®XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 600 (Java is a trademark of Sun Microsystems, Inc. in the United States, other countries, or both).

As a server, data processing system 600 may be, for example, an IBM® eServer™ System p® computer system, running the Advanced Interactive Executive (AIX) operating system or the LINUX® operating system (eServer, System p, and AIX are trademarks of International Business Machines Corporation in the United States, other countries, or both while LINUX is a trademark of Linus Torvalds in the United States, other countries, or both). Data processing system 600 may be a symmetric multiprocessor (SMP) system including a plurality of processors in processing unit 606. Alternatively, a single processor system may be employed.

Instructions for the operating system, the object-oriented programming system, and applications or programs are located on storage devices, such as HDD 626, and may be loaded into main memory 608 for execution by processing unit 606. The processes for illustrative embodiments of the present invention may be performed by processing unit 606 using computer usable program code, which may be located in a memory such as, for example, main memory 608, ROM 624, or in one or more peripheral devices 626 and 630, for example.

A bus system, such as bus 638 or bus 640 as shown in FIG. 6, may be comprised of one or more buses. Of course, the bus system may be implemented using any type of communication fabric or architecture that provides for a transfer of data between different components or devices attached to the fabric or architecture. A communication unit, such as modem 622 or network adapter 612 of FIG. 6, may include one or more devices used to transmit and receive data. A memory may be, for example, main memory 608, ROM 624, or a cache such as found in NB/MCH 602 in FIG. 6.

Those of ordinary skill in the art will appreciate that the hardware in FIGS. 5 and 6 may vary depending on the implementation. Other internal hardware or peripheral devices, such as flash memory, equivalent non-volatile memory, or optical disk drives and the like, may be used in addition to or in place of the hardware depicted in FIGS. 5 and 6. Also, the processes of the illustrative embodiments may be applied to a multiprocessor data processing system, other than the SMP system mentioned previously, without departing from the spirit and scope of the present invention.

Moreover, the data processing system 600 may take the form of any of a number of different data processing systems including client computing devices, server computing devices, a tablet computer, laptop computer, telephone or other communication device, a personal digital assistant (PDA), or the like. In some illustrative examples, data processing system 600 may be a portable computing device which is configured with flash memory to provide non-volatile memory for storing operating system files and/or user-generated data, for example. Essentially, data processing system 600 may be any known or later developed data processing system without architectural limitation.

Using the electrical behavior of receiver circuitry, the illustrative embodiments provide a discriminator circuit that detects three voltage states: normally high-voltage state, normally low-voltage state, and false (clamped) low-voltage state. While the illustrative embodiments may be applied to both hot-plugging and hot-unplugging, the following description is described in the terms of a hot-plugging condition. An output signal from the discriminator circuit degates (disables) interface circuitry that is normally received from the card being hot plugged. As such, degating the interface circuitry may prevent erroneous behavior due to non-deterministic states of key interface signals such as clock signals, reset signals, interrupt signals, or the like. That is, when a hot-plug condition occurs, the discriminator circuit detects the event and latches the voltage state for use in disabling any downstream circuitry that could otherwise be adversely affected. Once the hot-plugged card is energized, the discriminator circuit may selectively enable functions. Within the illustrative embodiments, the discriminator circuit may also include various time delays for enabling functions so as to predict when the hot-plugged card is completely operational. This may be accomplished by having the discriminator output being sensed by an onboard microprocessor, which in turn would manage the enablement function.

As part of the illustrative embodiments, the discriminator circuit may be implemented as part of the normal receiver interface for specific signals that are adversely affected by the hot-plugging condition. For example, a signal that is generally distributed (shared) within a fabric based system is an Early Power-Off Warning (EPOW) signal. If an installed card receives a falsely asserted EPOW signal from a card that is being hot plugged into a shared system, then the installed card may detect a false error of the EPOW condition and inappropriately handle this error condition.

Figure 7:
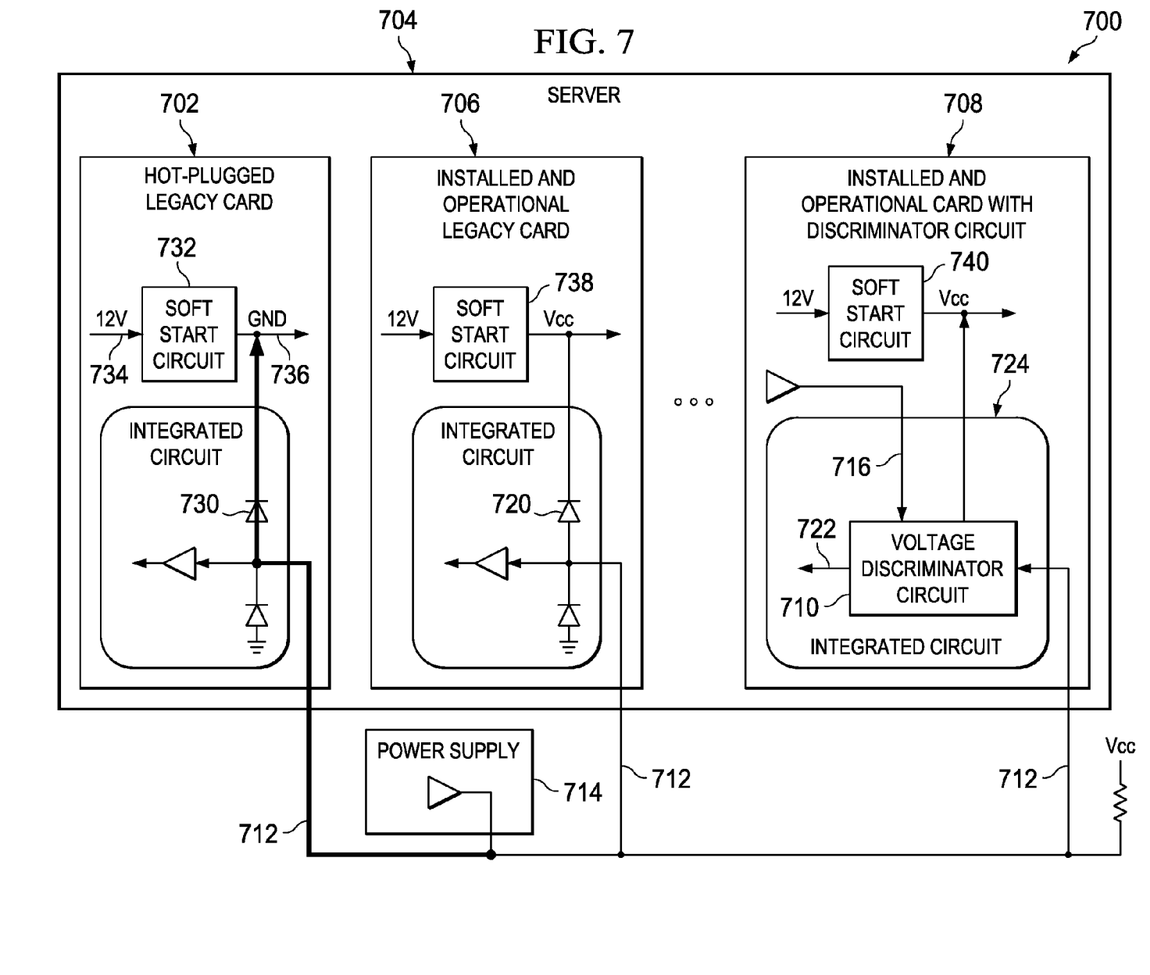
FIG. 7 illustrates the behavior of a card when it is hot plugged into a server in accordance with an illustrative embodiment.

FIG. 7 illustrates the behavior of a card when it is hot plugged into a data processing system in accordance with an illustrative embodiment. While cards may be hot plugged into a client computer, a switch, a router or other type of data processing system, the illustrative embodiment illustrates hot plugging a card into a server for illustrative purposes. In data processing system 700 when card 702 is hot plugged into server 704, there is a short transitional time, e.g. 10 milliseconds, during which the effects of hot plugging card 702 into server 704 may cause a clamp diode effect. When card 702 is hot plugged into server 704, soft start circuit 732 energizes. The initial conditions associated with soft start circuit 732 comprise 12V input 734 and output voltage level 736 of 0 volts, which may be referred to as Time A. Soft start circuit 732 requires a finite amount of time to become fully energized, which may be referred to as Time B. At the end of Time B, output voltage level 736 from soft start circuit 732 is generally a normal Vcc voltage level, for example, the same voltage level as soft start circuits 738 and 740 in installed and operational cards 706 and 708. During Time A, output voltage level 736 of card 702 is effectively at a ground (GND) voltage potential. While this ground voltage potential is present on the cathode of ESD protection clamp diode 730, Signal_A 712 may become clamped to one diode drop above ground. Since this voltage level is below the acceptable threshold voltage level of the receiver circuit, Signal_A 712 may then be detected as a low-state signal by cards 706 and 708 to be negatively asserted. When Time A completes and Time B starts, the output voltage level 736 of soft start circuit 732 should have reached an operational Vcc voltage level and Signal_A 712 may no longer be clamped and returns to its normal operating voltage level.

Thus, during the hot plugging of card 702 into server 704 ESD protection clamp diode 730 may become forward biased (i.e. conduct electricity) for a short period of time. Card 706, which is a legacy installed card, and card 708, which is a new card that incorporates discriminator circuit 710, may be already installed in server 704 and may be powered up to a full voltage level or full power. In known systems, there is some sharing of common critical signals among cards 702, 706, and 708, such as clock signals, reset signals, Early Power-Off Warning signals, and the like. This forward bias condition that may result from card 702 being hot plugged into server 704 may result in, for example, Signal_A input 712 being clamped to, for example, one diode drop, Vdiode, above ground, or the like. Thus, cards 706 and 708, which incorporate Signal_A input 712 may be exposed to the forward bias condition.

Discriminator circuit 710 implemented in card 708 filters Signal_A input 712 so that any falsely initiated low-state signals from hot-plugged card 702 may be ignored. Since card 702 is the card being hot plugged, discriminator circuit 710 within installed and operational card 708 compares Signal_A input 712 from power supply 714 to static voltage 716. When Signal_A input 712 is greater than static voltage 716, discriminator circuit 710 asserts Signal_A' output 722 as a normal high-voltage state, which is then validly used by integrated circuit 724. Conversely, when Signal_A input 712 is less than or equal to static voltage 716, discriminator circuit 710 asserts Signal_A' output 722 as a valid low-voltage state, which is then validly used by integrated circuit 724. As such, even if hot plugging card 702 into server 704 causes a falsely asserted low or high signal, discriminator circuit 710 discriminates against voltages above and below static voltage 716 and outputs only a valid normal high-voltage state or a valid low-voltage state. However, card 706 that does not have a discriminator circuit may still be subject to the falsely asserted signals from card 702 being hot plugged, which may cause ESD protection clamp diode 720 to be falsely clamped to, for example, one diode drop, Vdiode, above ground, or the like.

For example, when card 702 is hot plugged, ESD protection clamp diode 730 may temporarily clamp Signal_A input 712 to approximately 0.8 volts, which discriminator circuit 710 in card 708 compares to static voltage 716 of, for example, 0.406 volts. Since Signal_A input 712 of 0.8 volts is greater than static voltage 716 of 0.406 volts, discriminator circuit 710 asserts Signal_A' output 722 as a normal high-voltage state. In this manner, the hot-plug condition will be filtered by discriminator circuit 710 such that it has no affect on card 708 or on the operation of data processing system 700. Once Signal_A input 712 is normal and card 702 is operational, should Signal_A input 712 be truly asserted low (<0.406 volts) discriminator circuit 710 will properly detect Signal_A input 712 as a valid low-voltage level.

Figure 8:
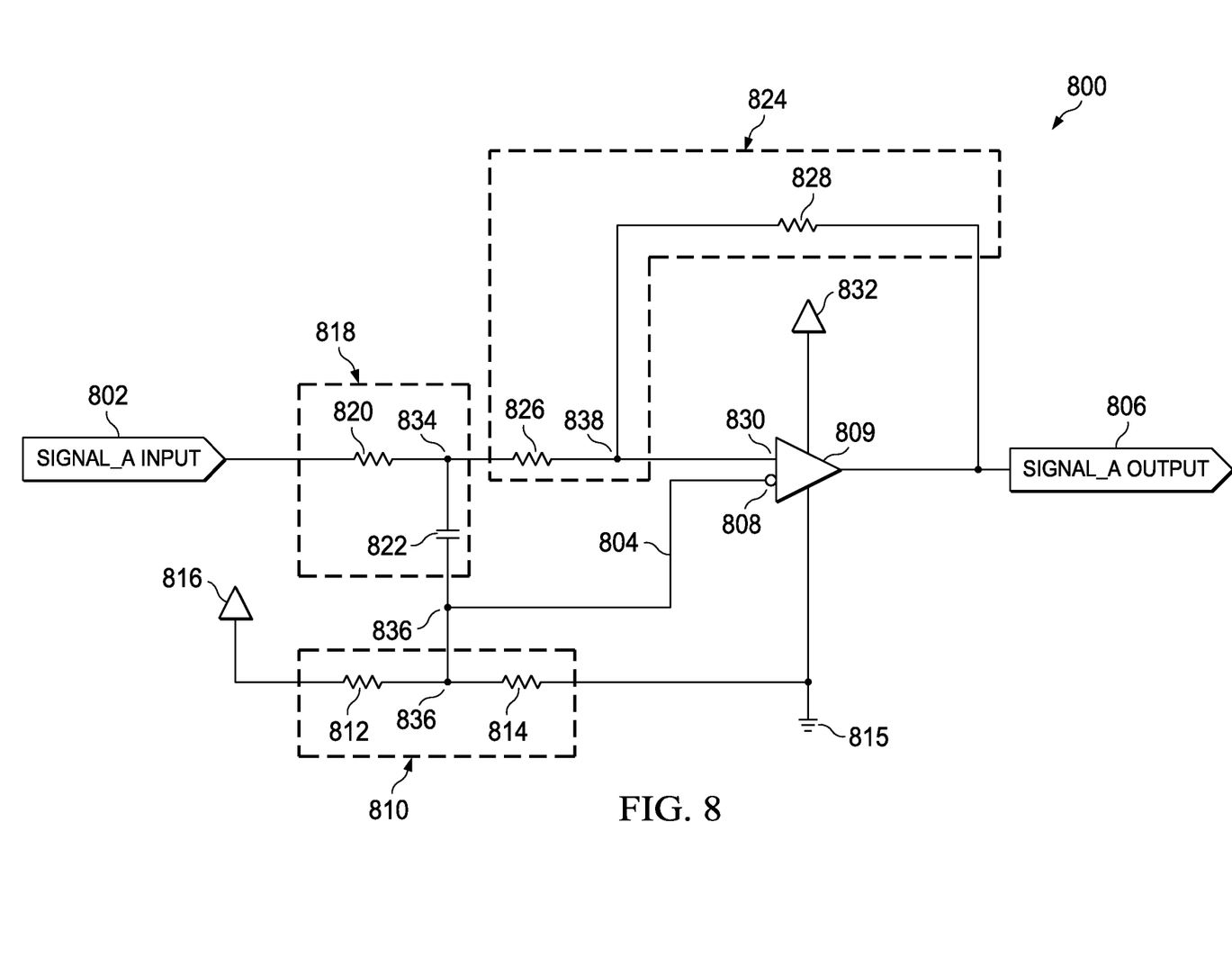
FIG. 8 depicts an exemplary discriminator circuit in accordance with an illustrative embodiment.

FIG. 8 depicts an exemplary discriminator circuit in accordance with an illustrative embodiment. In general, discriminator circuit 800, which may be implemented in a card such as card 702, 706, or 708 of FIG. 7, is a voltage comparator that compares the voltage of Signal_A input 802 to static voltage 804. When the voltage of Signal_A input 802 is a higher voltage than static voltage 804, discriminator circuit 800 asserts Signal_A output 806 as a high-voltage state. When the voltage of Signal_A input 802 is lower than static voltage 804, discriminator circuit 800 asserts Signal_A output 806 as a low-voltage state.

In discriminator circuit 800, pin 808 on op amp 809 is set to static voltage 804 as defined by resistor divider network 810. Resistor divider network 810 may be comprised of two resistors 812 and 814, where resistors 812 and 814 are coupled together to provide static voltage 804. Static voltage 804 may be provided to pin 808 of op amp 809 and to one side of capacitor 822, which will be described later. To provide static voltage 804, the other side of resistor 812 is coupled to voltage source 816, which may be for example 3.3 volts, and the other side of resistor 814 is coupled to ground 815, which is zero voltage potential. Thus, static voltage 804 may be calculated using the following formula: voltage at voltage source 816×[value of resistor 814/(value of resistor 812+value of resistor 814)]=static voltage 804. For example, using 3.3 volts as the voltage at voltage source 816, 3.01 kilo ohms as the value of resistor 812, 422 ohms as the value of resistor 814, static voltage 804 may be calculated as 3.3 volts×[422Ω/ (3.01K Ω+422Ω)]=0.406V.

In discriminator circuit 800, noise suppression network 818 suppresses electrical noise, which may effect the correct operation of discriminator circuit 800. Noise suppression network 818 may be comprised of resistor 820 and capacitor 822. In noise suppression network 818, one side of resistor 820 is coupled to Signal_A input 802 and the other side of resistor 820 is coupled to one side of capacitor 822 and to one side of resistor 826, which will be described later. Noise suppression network 818 operates by coupling any AC noise associated with Signal_A input 802 to capacitor 822 at junction 834. In turn, the AC noise of Signal_A input 802 is further coupled to op amp 809 by pin 808 through junction 836 and pin 830 through junction 838, the latter coupling via resistor 826. Therefore, effectively, any AC noise of Signal_A input 802 is received by both inverting and non-inverting inputs to op amp 809, which in turn is canceled or filtered by op amp 809 and is not present in Signal_A output 806.

In discriminator circuit 800, hysteresis network 824 provides memory to discriminator circuit 800 of the transitions of Signal_A. Hysteresis network 824 may be comprised on resistors 826 and 828. In hysteresis network 824, one side of resistor 826 is coupled to one side of resistor 820 and to one side of capacitor 822 and the other side of resistor 826 is coupled to resistor 828 and to pin 830 of op amp 809. The other side of resistor 828 is coupled to Signal_A output 806. Hysteresis is provided by hysteresis network 824 by providing positive feedback from Signal_A output 806 to op amp 809 via resistor 828. Op amp 809 receives a negative signal at pin 808, which is a constant voltage generated by voltage source 816. Op amp 809 receives positive input at pin 830 from Signal_A input 802 with hysteresis by positive feedback from Signal_A output 806. Op amp 809 may provide a stable output if voltage level of Signal_A input 802 is very close to static voltage 804.

In discriminator circuit 800, op amp 809 is coupled to voltage source 832 and ground 815. Op amp 809 has two inputs, Signal_A input 802 and static voltage 804, and one output Signal_A output 806. When op amp 809 receives Signal_A input 802 at pin 830, op amp 809 compares Signal_A input 802 to static voltage 804. When op amp 809 determines that Signal_A input 802 is greater than static voltage 804, op amp 809 asserts Signal_A output 806 as a normal high-voltage state. Conversely, when op amp 809 determines that Signal_A input 802 is less than or equal to static voltage 804, op amp 809 asserts Signal_A output 806 as a valid low-voltage state. As such, discriminator circuit 800 discriminates against voltages above and below static voltage 804.

In an alternative embodiment, each card may implement two discriminator circuits, such as discriminator circuit 800, in order to take advantage of the hot-plug condition rather than filter it out. For this embodiment, one discriminator circuit may be implemented with an op amp A that has a static voltage of, for example, 0.8 volts and the other discriminator circuit may be implemented with an op amp B that has a static voltage of, for example, 0.4 volts. When op amp A indicates a normal high condition but op amp B indicates a false low condition, then a hot-plug condition is detected. Detecting the hot-plug condition may then be used by the integrated circuit to ignore any signals from the hot-plugged card during the time which the hot-plug condition is detected and/or the hot plug condition may be sent to a management module in the server, from which the management module may send signals to all cards in the server so that signals from the hot-plugged card may be ignored during the time which the hot-plug condition is detected.

Figure 9:
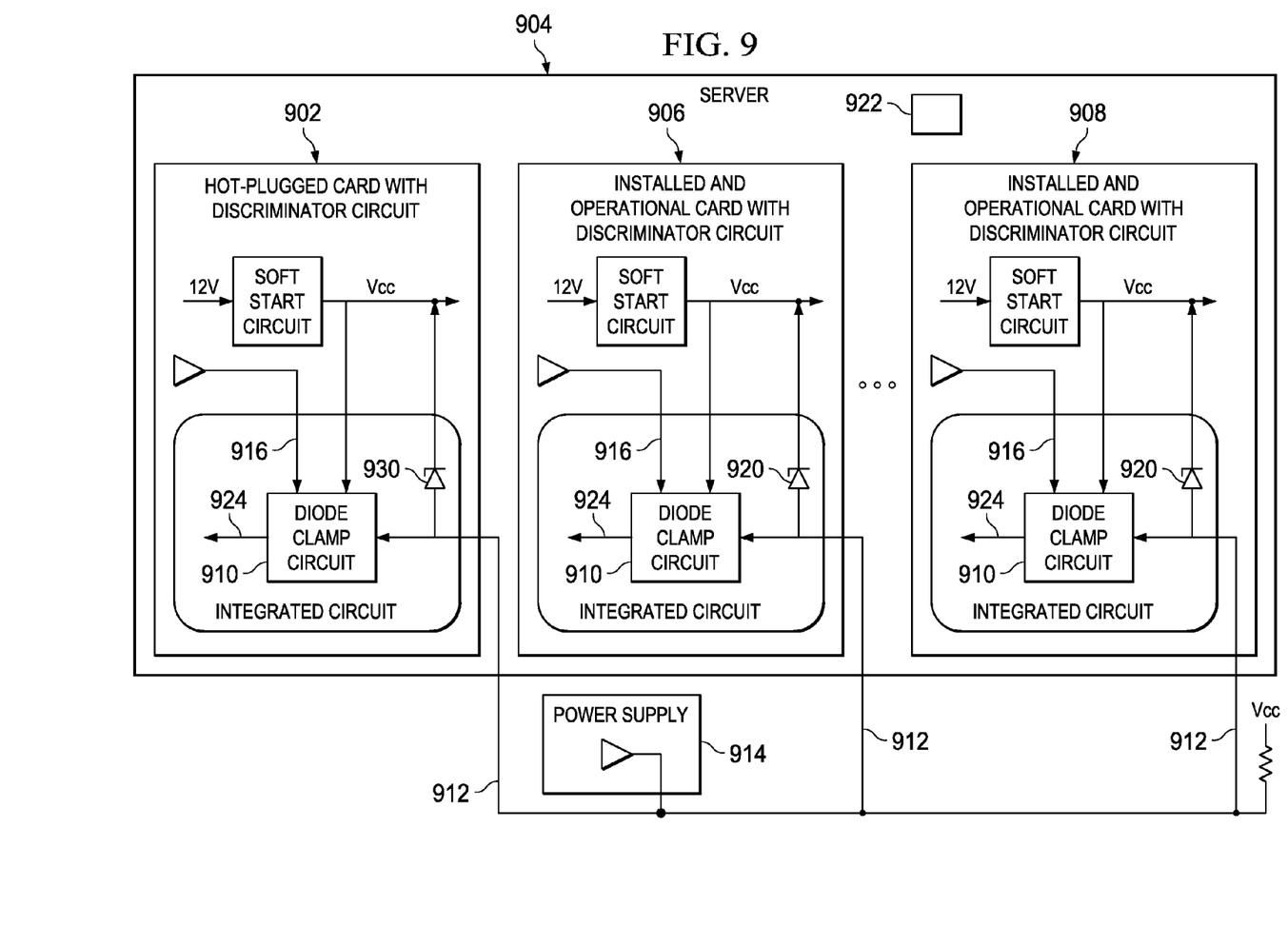
FIG. 9 illustrates the behavior of cards that implement a diode clamp in accordance with an illustrative embodiment.

In another embodiment, each card may, in addition to the discriminator circuit described above, or in lieu thereof, implement an identifying diode clamp circuit on a shared signal amongst the cards in order to identify the type of card being installed into the server. FIG. 9 illustrates the behavior of cards that implement an identifying diode clamp circuit in accordance with an illustrative embodiment. In this example, when card 902 is hot plugged into server 904, Signal_A input 912 from power supply 914 is intentionally clamped to a Vdiode drop across zener diode 930 above the effective ground level that is generated when card 902 is initially powered on. This diode clamp voltage across zener diode 930 may be tuned by using a zener diode of a specific voltage rating. A zener diode is a type of diode that permits current to flow in the forward direction like a normal diode, but also in the reverse direction if the voltage is larger than the breakdown voltage known as "zener knee voltage" or "zener voltage". Tuning of zener diode 930 is achieved by selecting different zener diodes, for example, one zener diode may have a Vdiode drop of 1.2 volts and another zener diode may have a Vdiode drop of 1.5 volts.

By implementing zener diodes within cards 902, 906, and 908 with different zener diode voltages, the type of card may be identified by diode clamp circuit 910 based on the Vdiode drop across zener diodes 930 or 920. Operating in a similar method to that of the voltage discriminator circuit described above, diode clamp circuit 910 may identify the Vdiode drop by implementing a resistor divider network, such as resistor divider network 810 of FIG. 8 that is unique to the Vdiode drop of the specific type of implemented zener diode. By providing a unique resistor divider network, diode clamp circuit 910 may compare the input created by static voltage 916 and the uniquely implemented resistor divider network to Signal_A input 912 to uniquely identify of the type of zener diode implemented in the card.

Once diode clamp circuit 910 identifies the type of zener diode based on the determined Vdiode drop, diode clamp circuit 910 may send Signal_A' output 924 to management module 922. Management module 922 may use Signal_A' output 924 to distinguish among the specific classes or types of cards installed in server 904. Additionally, when card 902 is hot plugged into server 904, cards 906 and 908, which also share Signal_A input 912, may be able to determine what "type" of card has been installed based on the detected Vdiode drop and take appropriate action as defined by the overall system architecture. Management module 922 may also use the determined Vdiode drop as an alert condition indicating that an "illegal" or invalid card has been installed and it should not be allowed to come online.

It should be appreciated that the illustrative embodiments may take the form of a specialized hardware embodiment, a software embodiment that is executed on a computer system having general processing hardware, or an embodiment containing both specialized hardware and software elements that are executed on a computer system having general processing hardware. In one exemplary embodiment, the mechanisms of the illustrative embodiments are implemented in a software product, which may include but is not limited to firmware, resident software, microcode, etc.

Furthermore, the illustrative embodiments may take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium may be an electronic, magnetic, optical, electromagnetic, or semiconductor system, apparatus, or device. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include compact disk-read-only memory (CD-ROM), compact disk-read/write (CD-R/W) and DVD.

The program code of the computer program product may comprise instructions that are stored in a computer readable storage medium in a client or server data processing system. In a client data processing system embodiment, the instructions may have been downloaded over a network from one or more remote data processing systems, such as a server data processing system, a client data processing system, or a plurality of client data processing systems using a peer-to-peer communication methodology. In a server data processing system embodiment, the instructions may be configured for download, or actually downloaded, over a network to a remote data processing system, e.g., a client data processing system, for use in a computer readable storage medium with the remote data processing system.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. An apparatus comprising:
an input; and
a discriminator circuit in a first card installed a data processing system, wherein the discriminator circuit receives a low-state signal via the input, wherein the low-state signal is the result of a second card being hot-plugged into the data processing system, and wherein, upon receiving the low-state signal, the discriminator circuit:
compares the low-state signal to a static signal;
responsive to the low-state signal being greater than the static signal, outputs a high-voltage signal, wherein the high-voltage signal output by the discriminator circuit indicates that the low-state signal is a false low signal and wherein, responsive to receiving the high-voltage signal by an integrated circuit within the first card, the intergrated circuit ignores common critical signals received from the second card; and
responsive to the low-state signal being less than or equal to the static signal, outputs a low-voltage signal, wherein the low-voltage signal output by the discriminator circuit indicates that the low-state signal is a valid low signal and wherein, responsive to receiving the low-voltage signal by the integrated circuit, the integrated circuit validly processes the common critical signals received from the second card.

2. The apparatus of claim 1, wherein the discriminator circuit comprises at least one of a resistor divider network, a noise suppression network, a hysteresis network and an op amp.

3. The apparatus of claim 2, wherein the resistor divider network comprises:
a first resistor and a second resistor,
wherein the first resistor is coupled to a voltage source, the second resistor, an input of the op amp, and the noise suppression network,
wherein the second resistor is coupled to a zero potential ground, the first resistor, the input of the op amp, and the noise suppression network, and
wherein the resistor divider network provides the static signal to the input of the op amp.

4. The apparatus of claim 2, wherein the noise suppression network comprises:
a resistor and a capacitor,
wherein the resistor is coupled to the low-state signal, the hysteresis network, and the capacitor, and
wherein the capacitor is coupled to the resistor, the hysteresis network, an input of the op amp, and the resistor divider network.

5. The apparatus of claim 2, wherein the hysteresis network comprises:
a first resistor and a second resistor,
wherein the first resistor is coupled to the noise suppression network, the second resistor, and an input of the op amp, and
wherein the second resistor is coupled to the first resistor, the input of the op amp, and an output of the op amp.

6. The apparatus of claim 2, wherein the op amp comprises:
a voltage source connection, a ground connection, a first input, a second input, and an output,
wherein the voltage source connection is coupled to a voltage source,
wherein the ground connection is coupled to a zero potential ground,
wherein the first input is coupled to the hysteresis network,
wherein the second input is coupled to the resistor divider network and the noise suppression network, and
wherein the output is coupled to the hysteresis network and wherein the output provides at least one of the high-voltage signal or the low-voltage signal based on the comparison of the low-state signal to the static signal.

7. A method for filtering signals, the method comprising:
comparing, by a discriminator circuit in a first card installed a data processing system, a low-state signal to a static signal, wherein the discriminator circuit receives the low-state signal via an input and wherein the low-state signal is the result of a second card being hot-plugged into the data processing system;
responsive to the low-state signal being greater than the static signal, outputting, by the discriminator circuit, a high-voltage signal, wherein the high-voltage signal output by the discriminator circuit indicates that the low-state signal is a false low signal and wherein, responsive to receiving the high-voltage signal by an integrated circuit within the first card, the integrated circuit ignores common critical signals received from the second card; and
responsive to the low-state signal being less than or equal to the static signal, outputting, by the discriminator circuit, a low-voltage signal, wherein the low-voltage signal output by the discriminator circuit indicates that the low-state signal is a valid low signal and wherein responsive to receiving the low-voltage signal by the integrated circuit, the integrated circuit validly processes the common critical signals received from the second card.

8. The method of claim 7, wherein the discriminator circuit comprises at least one of a resistor divider network, a noise suppression network, a hysteresis network and an op amp.

9. The method of claim 8, wherein the resistor divider network comprises:
   a first resistor and a second resistor,
      wherein the first resistor is coupled to a voltage source, the second resistor, an input of the op amp, and the noise suppression network,
      wherein the second resistor is coupled to a zero potential ground, the first resistor, the input of the op amp, and the noise suppression network, and
      wherein the resistor divider network provides the static signal to the input of the op amp.

10. The method of claim 8, wherein the noise suppression network comprises:
    a resistor and a capacitor,
       wherein the resistor is coupled to the low-state signal, the hysteresis network, and the capacitor, and
       wherein the capacitor is coupled to the resistor, the hysteresis network, an input of the op amp, and the resistor divider network.

11. The method of claim 8, wherein the hysteresis network comprises:
    a first resistor and a second resistor,
       wherein the first resistor is coupled to the noise suppression network, the second resistor, and an input of the op amp, and
       wherein the second resistor is coupled to the first resistor, the input of the op amp, and an output of the op amp.

12. The method of claim 8, wherein the op amp comprises:
    a voltage source connection, a ground connection, a first input, a second input, and an output,
       wherein the voltage source connection is coupled to a voltage source,
       wherein the ground connection is coupled to a zero potential ground,
       wherein the first input is coupled to the hysteresis network,
       wherein the second input is coupled to the resistor divider network and the noise suppression network, and
       wherein the output is coupled to the hysteresis network and wherein the output provides at least one of the high-voltage signal or the low-voltage signal based on the comparison of the low-state signal to the static signal.

13. A discriminator circuit in a first card installed a data processing system comprising:
    a resistor divider network;
    a noise suppression network;
    a hysteresis network; and
    an op amp, wherein, upon receiving a low-state signal that is the result of a second card being hot-plugged into the data processing system, the op amp:
       compares the low-state signal received via the hysteresis network to a static signal received via the noise suppression network and the resistor divider network;
       responsive to the low-state signal being greater than the static signal, outputs a high-voltage signal, wherein the high-voltage signal output by the op amp indicates that the low-state signal is a false low signal and wherein, responsive to receiving the high-voltage, signal by an integrated circuit within the first card, the integrated circuit ignores common critical signals received from the second card; and
       responsive to the low-state signal being less than or equal to the static signal, outputs a low-voltage signal, wherein the low-voltage signal output by the op amp indicates that the low-state signal is a valid low signal and wherein, responsive to receiving the low-voltage signal by the integrated circuit, the integrated circuit validly processes the common critical signals received from the second card.

14. The discriminator circuit of claim 13, wherein the resistor divider network comprises:
    a first resistor and a second resistor,
       wherein the first resistor is coupled to a voltage source, the second resistor, an input of the op amp, and the noise suppression network,
       wherein the second resistor is coupled to a zero potential ground, the first resistor, the input of the op amp, and the noise suppression network, and
       wherein the resistor divider network provides the static signal to the input of the op amp.

15. The discriminator circuit of claim 13, wherein the noise suppression network comprises:
    a resistor and a capacitor,
       wherein the resistor is coupled to the low-state signal, the hysteresis network, and the capacitor, and
       wherein the capacitor is coupled to the resistor, the hysteresis network, an input of the op amp, and the resistor divider network.

16. The discriminator circuit of claim 13, wherein the hysteresis network comprises:
    a first resistor and a second resistor,
       wherein the first resistor is coupled to the noise suppression network, the second resistor, and an input of the op amp, and
       wherein the second resistor is coupled to the first resistor, the input of the op amp, and an output of the op amp.

17. The discriminator circuit of claim 13, wherein the op amp comprises:
    a voltage source connection, a ground connection, a first input, a second input, and an output,
       wherein the voltage source connection is coupled to a voltage source,
       wherein the ground connection is coupled to a zero potential ground,
       wherein the first input is coupled to the hysteresis network,
       wherein the second input is coupled to the resistor divider network and the noise suppression network, and
       wherein the output is coupled to the hysteresis network and wherein the output provides at least one of the high-voltage signal or the low-voltage signal based on the comparison of the low-state signal to the static signal.

* * * * *